United States Patent [19]

Beriger et al.

[11] Patent Number: 5,544,035
[45] Date of Patent: Aug. 6, 1996

[54] CONVERTER ARRANGEMENT HAVING A LOW-INDUCTANCE COMMUTATION CIRCUIT

[75] Inventors: Conrad Beriger, Aarau; Horst Grüning, Wettingen; Herbert Stemmler, Kirchdorf; Johannes Werninger, Zürich, all of Switzerland

[73] Assignee: ABB Management AG, Baden, Switzerland

[21] Appl. No.: 360,624

[22] Filed: Dec. 21, 1994

[30] Foreign Application Priority Data

Dec. 23, 1993 [DE] Germany ............... 43 44 135.1

[51] Int. Cl.⁶ .................. H02M 7/5387; H02M 7/515
[52] U.S. Cl. .................................. 363/132; 363/135
[58] Field of Search ........................ 363/57, 58, 96, 363/98, 132, 135, 136, 141

[56] References Cited

U.S. PATENT DOCUMENTS

| 5,210,451 | 5/1993 | Gruning et al. | 307/633 |
| 5,235,487 | 8/1993 | Gruning | 363/58 |
| 5,237,225 | 8/1993 | Gruning | 363/135 |
| 5,375,054 | 12/1994 | Gaupp | 363/132 |

FOREIGN PATENT DOCUMENTS

| 0166968B1 | 5/1985 | European Pat. Off. . |
| 0277546A1 | 1/1988 | European Pat. Off. . |
| 4023687A1 | 1/1992 | Germany . |
| 4105155A1 | 9/1992 | Germany . |
| 4230510C1 | 9/1993 | Germany . |
| 578276 | 12/1974 | Switzerland . |

Primary Examiner—Matthew V. Nguyen
Attorney, Agent, or Firm—Burns, Doane, Swecker & Mathis

[57] ABSTRACT

A converter circuit arrangement is specified which is constructed to have a particularly low inductance. This is achieved by the circuit area of the commutation circuit being kept as small as possible. A circuit area which is as small as possible is achieved by the branch modules and switch modules of a phase module being arranged either in a U-shape or in a meandering shape. The branch modules can be arranged either parallel to or at right angles to a main direction, between the positive and negative connections and the load connection. In addition, it is advantageous if the power semiconductor switches and the reverse-connected parallel diodes and freewheeling diodes are arranged in separate stacks which are held together by means of a clamping-in device.

12 Claims, 6 Drawing Sheets

CONVERTER ARRANGEMENT HAVING A LOW-INDUCTANCE COMMUTATION CIRCUIT

BACKGROUND OF THE INVENTION

1. Field of Invention

The invention relates to the field of power electronics.

It is based on a converter arrangement according to the preamble of the first claim.

2. Discussion of Background

Such a converter arrangement has already been described, for example, in the German Laid Open Specification DE 40 23 687 A1.

This is a so-called U-converter, that is to say a converter having a DC intermediate circuit and a capacitor bank. Such a converter normally comprises a plurality of phases, which each comprise two branch modules. The branch modules have at least two switch modules which are connected in series and, with their center connection, form a load connection. Either the positive voltage or the negative voltage of the DC intermediate circuit is connected to the load connection by switching the switches in one branch on and off alternately.

In contrast to this, so-called I-converters were primarily used until a short time ago, that is to say converters which have a large inductance instead of a capacitor bank, which large inductance decouples the two three-phase bridges. Since there was thus already a large inductance in the intermediate circuit anyway, the circuit arrangements did not need to be optimized with respect to parasitic inductances.

However, the influence of parasitic inductances in the case of U-converters is now not negligible. Particularly during commutation of the current from one bridge branch to the other, the commutation current should be opposed by as little inductance as possible in order that as little voltage as possible occurs across the semiconductor, in accordance with $UL=L*(di/dt)$, during the changeover.

SUMMARY OF THE INVENTION

Accordingly, one object of the invention is to provide a novel converter circuit arrangement which is distinguished by a construction having as low an inductance as possible.

This object is achieved in the case of a converter circuit arrangement of the type mentioned initially by the features of the first claim.

A converter arrangement according to the invention comprises at least one phase module, which comprises one phase of a bridge circuit and, for its part, comprises two branch modules. The branch modules have at least two series-connected switch modules, which comprise a power semiconductor component, including its switch, circuitry, freewheeling and current-limiting networks.

The essence of the invention is now to arrange the branch modules within a phase module such that a commutation circuit, which is formed by the DC intermediate circuit, the positive and negative connections and the corresponding branch modules, comprises a circuit area which is as small as possible. This results in one switch contributing at most 500 nH to the stray inductance of a phase module. The stray inductance of the commutation circuit is proportional to the circuit area, so that, if the circuit area is as small as possible, only a small voltage is produced on the semiconductor switch. For an inductance which is so small, it is also necessary for the positive connection and the negative connection to be as close as possible, that is to say to be moved together to just before a flashover point.

A first exemplary embodiment is distinguished by the branch modules being arranged parallel to a main direction running between the positive and negative connections and the load connection. In a second exemplary embodiment, the branch modules are arranged at right angles thereto. In both variants, the branch modules and their switch modules can be arranged in the form of a "U" or in a meandering shape.

A further embodiment is distinguished by an even number of phase modules being provided and the branches of in each case two phase modules being arranged in mirror-image symmetry with respect to a separating plane. The separating plane is in this case formed by the busbar of either the positive connection or the negative connection.

A common feature of all three exemplary embodiments is that the power semiconductor switches and their diodes of the freewheeling circuit or their reverse-connected parallel diodes are preferably arranged in separate stacks.

If, in addition, a plurality of planes of branch modules and switch modules, which are arranged in a U-shape or in a meandering shape, are positioned side-by-side or one above the other, then the switch modules are preferably arranged such that the magnetic fields which are formed in conductor loops formed by the switch modules just cancel one another out in the adjacent planes.

A further variant of the construction according to the invention is distinguished by a coaxial arrangement. In this case, the positive connection and negative connection each form a hollow cylinder, which cylinders surround the branch modules and switch modules.

Further exemplary embodiments result from the sub-claims.

The advantage of the power semiconductor module according to the invention is that its construction has a very low inductance. In consequence, a voltage which is as small as possible is built up during a change in the current through the switches. In consequence, the switching losses are considerably reduced and the arrangement can be operated at higher frequencies.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Referring now to the drawings, the reference numerals used in the drawings, and their meanings are listed in summarized form in the list of designations. In principle, like reference numerals designate identical or corresponding parts throughout the several views. For clarity, in FIGS. 1 and 2, the components are shown in only one switch module in FIG. 1.

Figure 1:
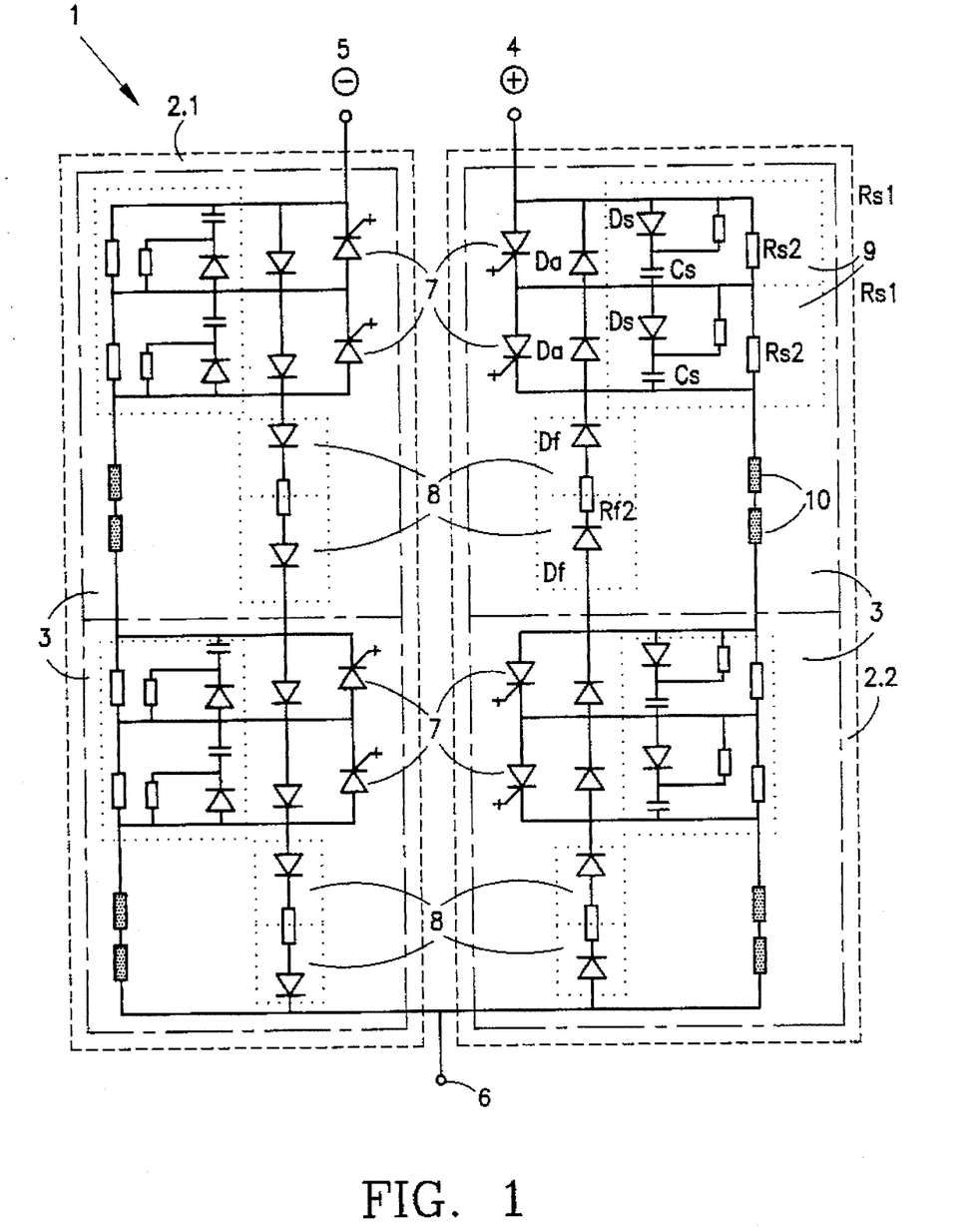
FIG. 1 shows the equivalent circuit diagram of one phase module.

FIG. 1 shows the equivalent circuit diagram of a single phase module (1) of a bridge circuit of the converter circuit arrangement according to the invention. Such a phase module (1) comprises two branch modules (2.1 and 2.2) which, for their part, comprise at least one—two in each case in the case illustrated—switch modules (3). In the following text, switch module (3) designates a power semiconductor component which comprises at least one power semiconductor switch (7) with the associated network for the freewheel (8), the circuitry (9) or the current limiter (10). In terms of circuitry, this arrangement and its method of operation are known and it is therefore not intended to describe them further here.

In operation, the current flows either through the one branch module (2.1) or through the other branch module (2.2) to the load. During the changeover, a commutation current must be built up which flows in the so-called commutation circuit, which is formed by the DC intermediate circuit (not illustrated), the positive connection (4) and the negative connection (5), and the branch modules (2.1, 2.2). According to the invention, the inductance of this commutation circuit is intended to be minimized. This is achieved by the circuit area of the commutation circuit being selected to be as small as possible.

Figure 5A:
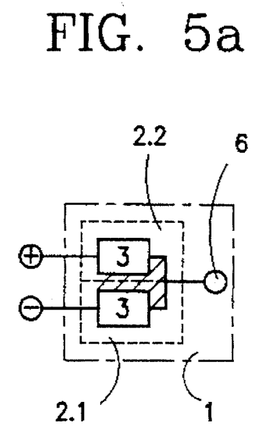
FIGS. 5a–f show further options of the arrangement according to the invention of the branch modules and switch modules.
Figure 5B:
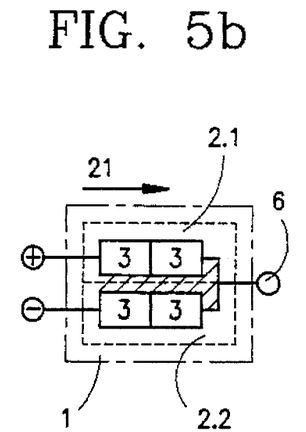
Figure 5C:
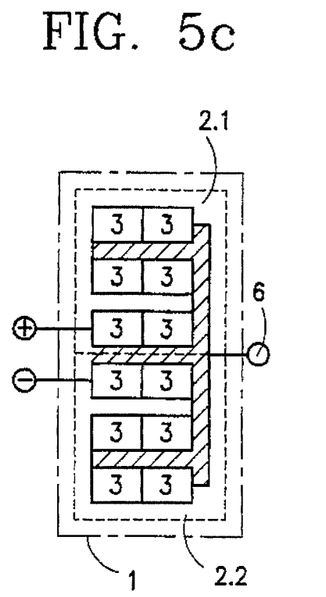
Figure 5D:
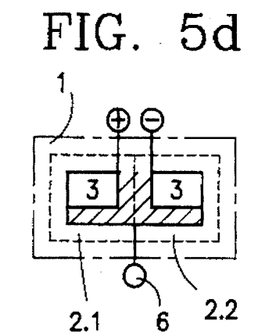
Figure 5E:
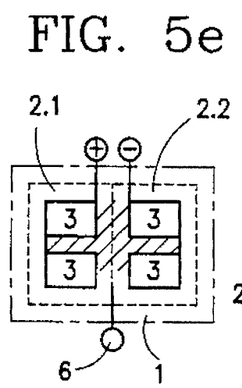
Figure 5F:
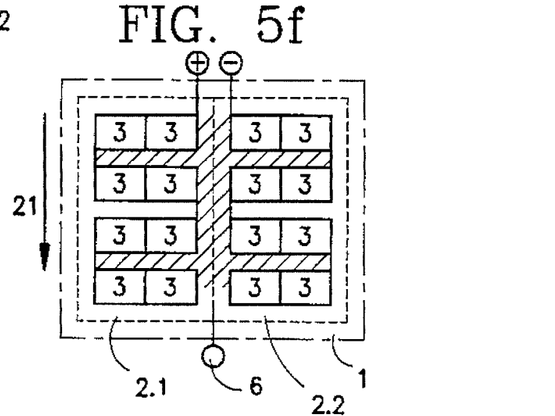

FIGS. 5a–f show various options for how this can be achieved. In principle, there are two variants in that the branch modules are arranged either parallel (FIGS. 5a–c) to a main direction (21) which runs along a connection line from the positive or negative connection to the load connection, or at right angles thereto. In this case, it is irrelevant whether the branch modules (2.1, 2.2) comprise only one switch module (3)—FIG. 5a—or a plurality of switch modules (3)—FIG. 5b. The branch modules (2.1, 2.2) can be arranged either in the form of a "U" (FIGS. 5a, 5b and FIGS. 5d, 5e) or in a meandering shape (FIG. 5c and FIG. 5f). A common feature of all variants is that the circuit area of the commutation circuit, which is illustrated in shaded form, is kept as small as possible.

Figure 2:
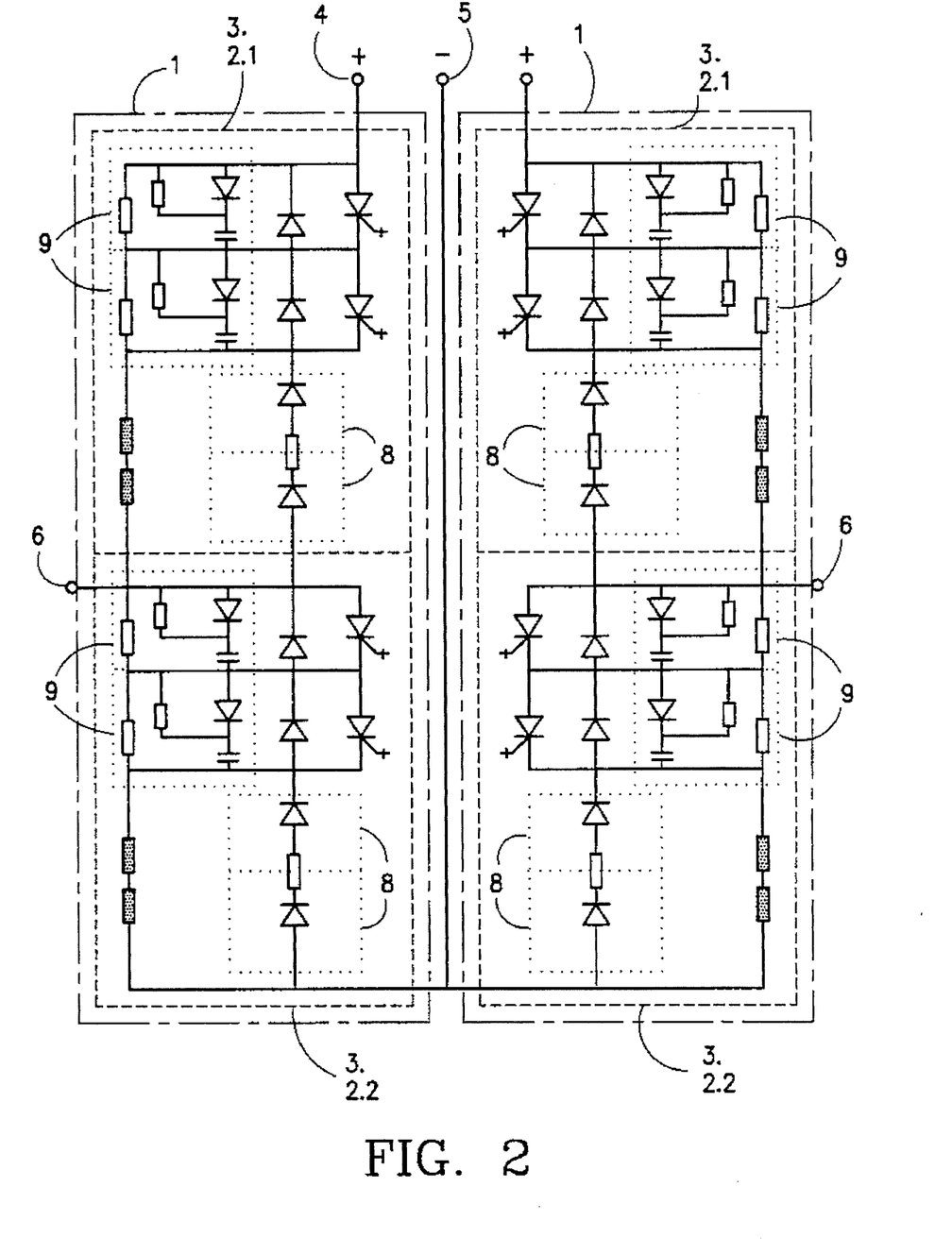
FIG. 2 shows the equivalent circuit diagram of two phase modules.
Figure 6:
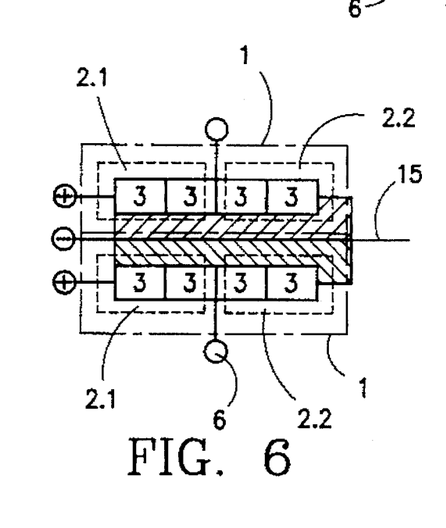
FIG. 6 shows the arrangement of the branch modules according to a further embodiment.

Normally, a converter comprises a plurality of such phase modules (1)—in particular three in the case of three-phase systems. These phase modules (1) are, of course, all constructed according to one of FIGS. 5a–f. In the case where an even number of phase modules are provided, however, another variant, which is illustrated in FIG. 6, is also possible. FIG. 2 shows the corresponding equivalent circuit diagram.

Here, the branch modules (2.1, 2.2) of in each case two phase modules (1) are arranged in mirror-image symmetry with respect to a separating plane (15). The positive and negative connections (4 and 5) are arranged on one side and the load connections are passed away to the side. The busbar of either the positive connection or the negative connection runs along the separating plane (15) (FIG. 6).

Figure 7:
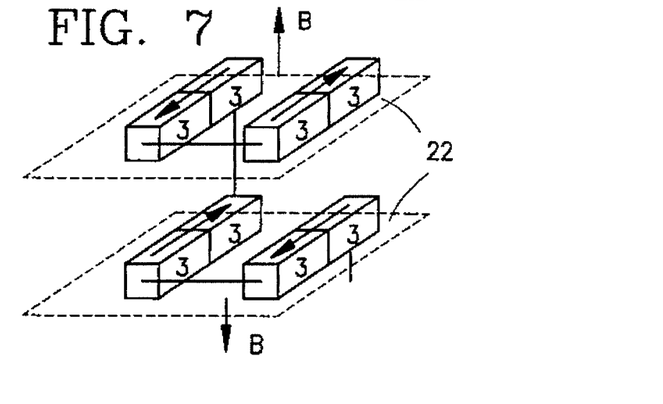
FIG. 7 shows the three-dimensional illustration of the arrangement of the switch modules.

The switch modules (3) of the branch modules (2.1, 2.2) can, of course, also be arranged one above the other or side-by-side. FIG. 7 shows, in a detail, how two planes of switch modules (3) are intended to be arranged. It is particularly advantageous if the switch modules (3) are interconnected such that the magnetic fields B, illustrated by arrows, of two opposite planes (22) just cancel one another out. The fields are in this case induced by the current in the conductor loops which, for example, a U-shaped arrangement forms.

A common feature of all the exemplary embodiments is that the power semiconductor switches (7) and the freewheeling diodes (Df) and reverse-connected parallel diodes (Da) are arranged in separate, parallel-running stacks which are held together by means of a clamping-in device (18).

Figure 3A:
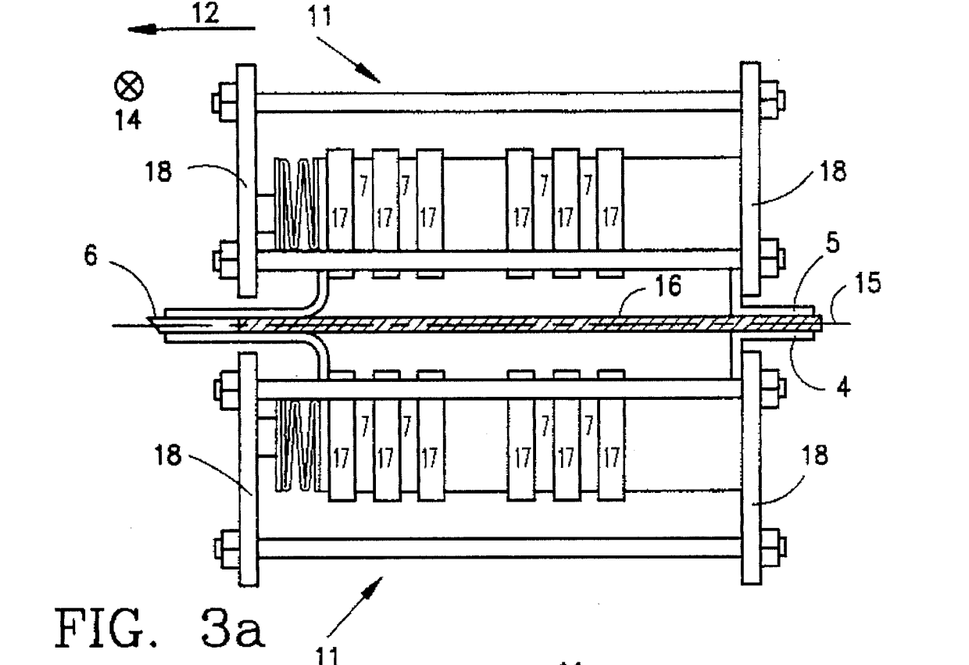
FIGS. 3a,b show the mechanical construction of the converter arrangement according to a first exemplary embodiment from above and from the side.

FIGS. 3a,b and 4a,b show this arrangement for the circuits according to FIGS. 1 and 2.

The phase module illustrated in FIG. 1 comprises the two branch modules (2.1 and 2.2) with a total of four switch modules (3) which are connected in series and can be connected to the positive connection (4) and to the negative connection (5) of, for example, a DC intermediate circuit. A diode (Da) is reverse-connected in parallel with each power semiconductor switch (7), and a circuitry network (9) is connected in parallel with it. In addition, one freewheeling circuit (8) and one current-rise limiting inductor (10) are provided per switch module (3). In contrast to the illustrated embodiment, the current-rise limiting inductors (10) can also be combined just as well.

The common connection in the center of the phase module (1) forms the load connection (6). The power semiconductor switches (7) are now driven in a known manner such that the load connection (6) is alternately connected to the positive connection (4) and to the negative connection (5). The number of series-connected power semiconductor switches (7) can in this case be selected such that the required dielectric strength results. It is thus not limited to the two illustrated. Likewise, more than two switch modules (3) can be interconnected per branch module (2.1 or 2.2).

Turn-off thyristors or gate-turn-off thyristors (GTOs) are preferably used as the power semiconductor switches (7). In this case, the freewheeling circuit (8) comprises a freewheeling diode (Df) as well as a common resistor (Rf2) which is connected in series with the freewheeling diodes (Df). It is not absolutely essential for one freewheeling diode (Df) to be provided per switch, it being possible to provide only one per switch module just as well. The circuitry network (9) has a circuitry diode (Ds), a parallel-connected resistor (Rs1), a capacitor (Cs) connected in series therewith, and a resistor (Rs2) which is connected in parallel with the overall circuitry. The method of operation of this element will not be described in detail since it is already known.

According to the invention, the power semiconductor switches (7) are now arranged in a switch stack (11) and the reverse-connected parallel diodes (Da) and freewheeling diodes (Df) are arranged in a dedicated diode stack (13).

Figure 3B:
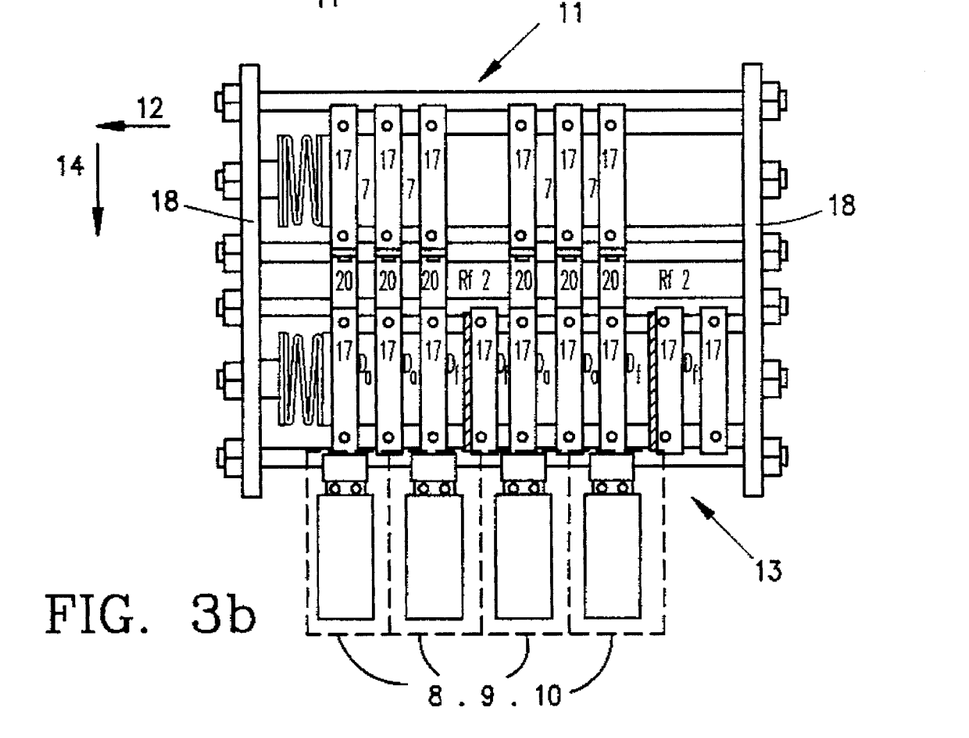

As FIG. 3a shows, the power semiconductor switches of the first branch module (2.1) and those of the second branch module (2.2) each form one switch stack (11). FIG. 3b shows the stack arrangement from the side. One of the switch stacks (11) is shown again at the top, and the diode stack (13) at the bottom. The stacks are in each case held together by a clamping-in device (18). Furthermore, the positive connection (4) and the negative connection (5) can be seen in FIG. 3a, which connection passes from the right side of the stack to in each case one of the adjacent switch stacks (11). The switch stacks (11) are connected on the opposite stack side, and form the load connection (6). The power semiconductor switches (7) of the switch stacks (11) are in this case connected to the associated diodes (Da, Df) of the diode stack (13), which is arranged underneath, via connecting pieces (20).

Cooling boxes (17) are in each case arranged between the power semiconductor switches (7) and the diodes (Da, Df) of a stack. A cooling fluid preferably flows through the cooling boxes (17).

The common resistor (Rf2) of the freewheeling circuit is preferably integrated, as a planar resistor, directly between two freewheeling diodes (Df) of a diode stack (13). The other elements of the circuitry (9) and of the freewheeling circuit (8) as well as the current-rise limiting inductor (10) are preferably arranged underneath the diode stacks (13), as is indicated schematically in FIG. 3b.

In principal, the stack arrangement according to the invention is thus distinguished by the fact that the power semiconductor switches of the switch modules are combined to form a switch stack, the stacks defining a stack direction;

the freewheeling diodes and reverse-connected parallel diodes of the switch modules form a diode stack, the diodes being connected to the corresponding switches along a connection direction which runs essentially at right angles to the stack direction, and the diode stacks being arranged in the connection direction under the switch stacks; and the switch stacks and diode stacks of one branch module being separated from those of the other by a plane whose normal vector is at right angles both to the stack direction and to the connection direction.

Figure 4A:
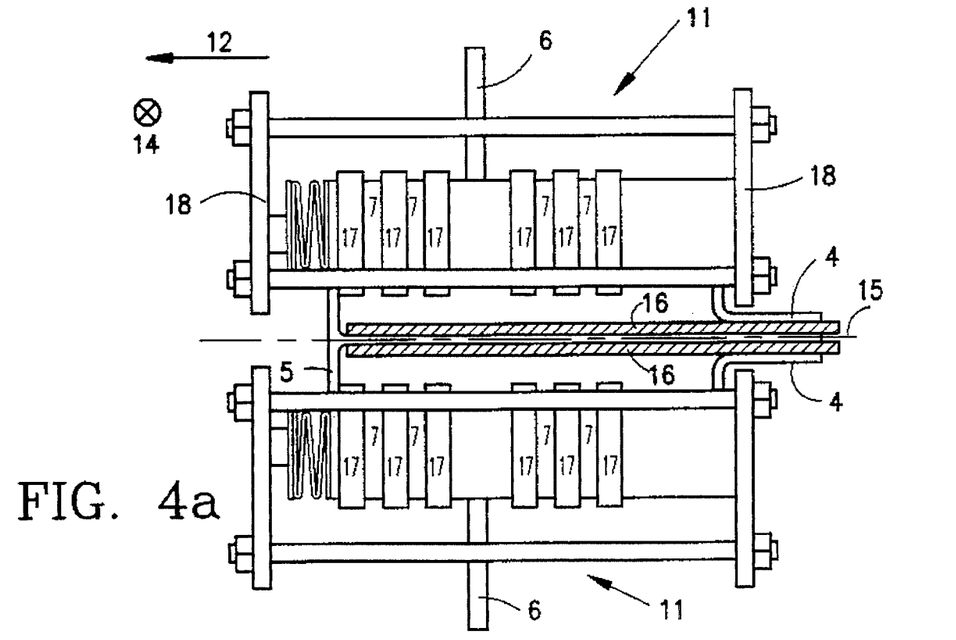
FIGS. 4a,b show the mechanical construction of the converter arrangement according to a further exemplary embodiment from above and from the side.
Figure 4B:
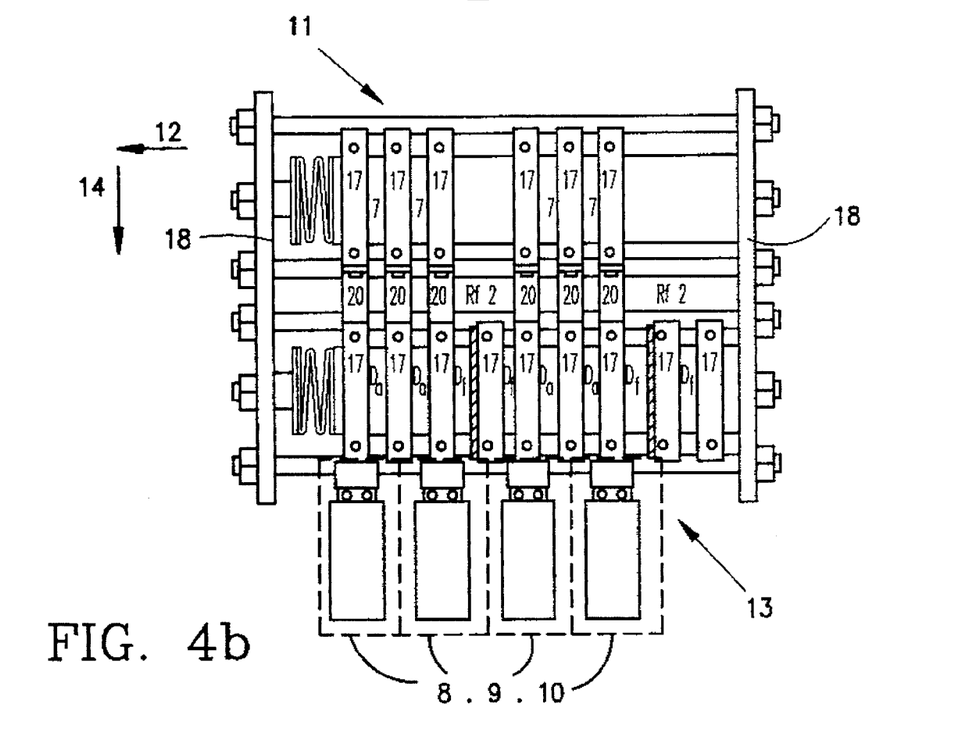

FIGS. 4a and 4b illustrate the mechanical construction of the exemplary embodiment according to FIG. 2. Once again, there are four switch modules (3) which, in principle, are of identical construction as those of the first exemplary embodiment. In contrast to FIG. 1, each half of the switch modules (3) now itself represents a complete phase module (1), however. This is now also reflected in a slightly different construction of the stacks. As can be seen in FIG. 4a, those two ends of one side of the switch stacks (11) which lie side-by-side are connected to the positive connection (4), while those on the other side are connected to the negative connection (5). The reverse situation would, of course, also be possible. The load connections (6) of the two phase modules (1) are passed out of the stack at the points of the common connection of each part of the bridge branch.

The arrangement of the diode stacks (13), of the freewheeling elements and of the circuitry elements corresponds to that of the first exemplary embodiment. This will therefore not be described in more detail at this point.

A common feature of both exemplary embodiments is that the busbars of the positive and negative connections can be separated by means of an insulation plate (16) which runs along the separating plane (15). If the distance between the two busbars is selected to be very small, this may even become a necessity.

So far, exemplary embodiments have always been discussed which have a total of 8 power semiconductor switches. However, this should not be seen as an absolute necessity. The branch modules (2.1, 2.2) of the phase module (1) of the first exemplary embodiment could just as well comprise 6 switches in each case, that is to say, for example, 3 switch modules having 2 switches or 2 switch modules having 3 switches. It is likewise conceivable for each phase module (1) of the second exemplary embodiment to comprise 4 switch modules of 2 switches or 2 switch modules of 3 switches. The stack arrangement according to the invention is thus not limited to a specific number of elements. The important feature is only that switch stacks and diode stacks are formed which are separated in each half of the module, and the stacks of the two halves are separated from one another by the described separating plane.

The mechanical construction just discussed is, of course, not limited only to these two exemplary embodiments but, in the same sense, can be applied to all those in the FIGS. 5a–f, 6 and 7.

Figure 8:
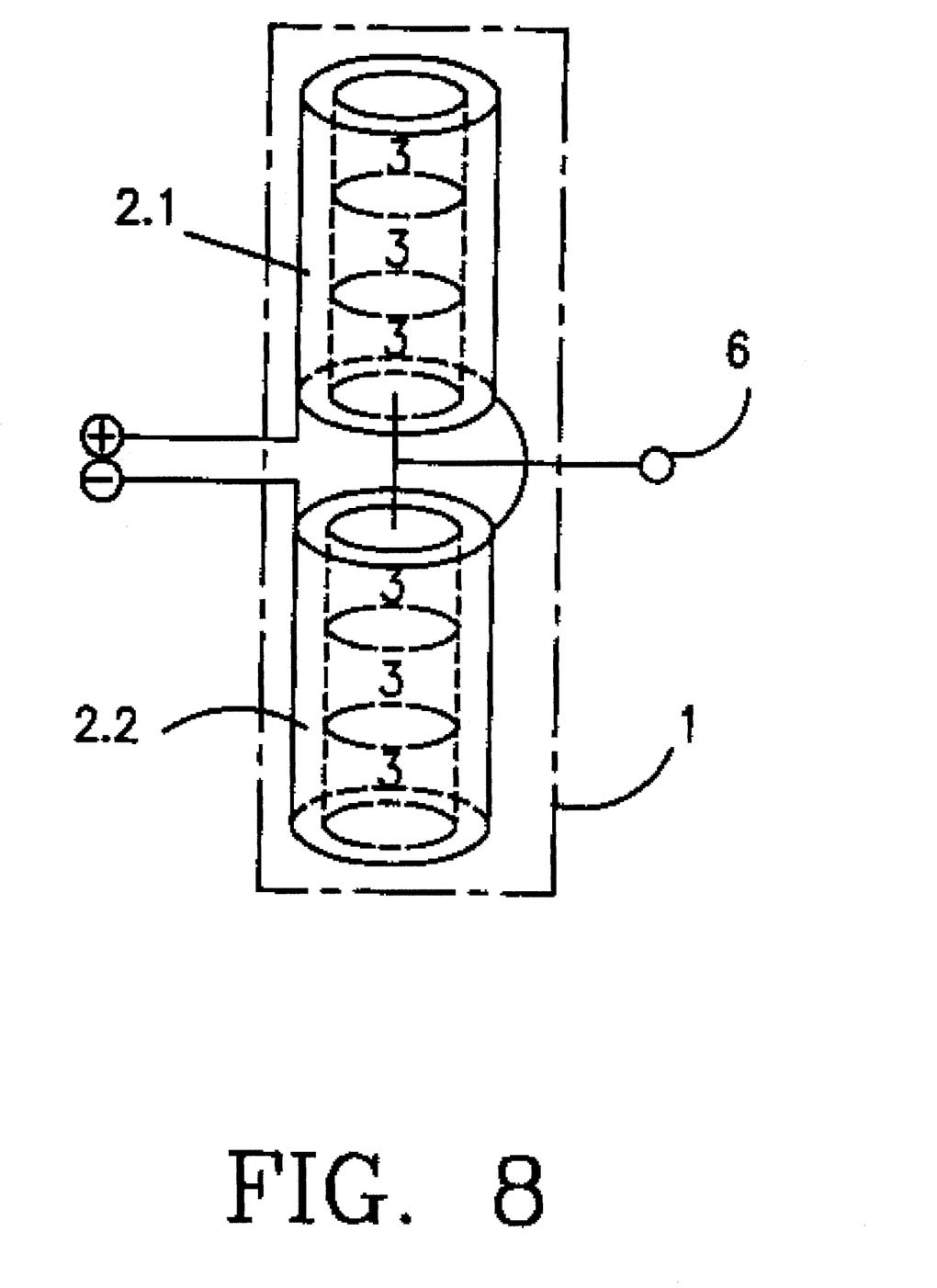
FIG. 8 shows a further variant of the construction according to the invention, with a coaxial arrangement.

Finally, FIG. 8 illustrates yet another variant of the construction according to the invention. Here, the positive connection (4) and the negative connection (5) each form a hollow cylinder, which cylinders coaxially surround the switch modules (3) and the branch modules (2.1, 2.2). The load connection (6) can be passed out between the cylinder of the positive connection (4) and that of the negative connection (5). A very low-inductance construction is thus likewise achieved in this way.

The explained mechanical construction, composed of separate switching stacks and diode stacks, together with the arrangements, which are illustrated only in outline, according to FIGS. 5a–f, 6 and 7, enables a very low-inductance construction. Thus, in consequence, a converter arrangement according to the invention has an optimum construction with respect to inductances. In consequence, the voltage across the switches during commutation processes can be kept low. As a consequence of this, the switching losses are lower, and the converter arrangement can be operated at higher frequencies.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by letters patent of the United States is:

1. A converter arrangement comprising:

a) at least one phase module of a bridge circuit, said at least one phase module comprising two branch modules which are connected in series and are connected respectively to a positive connection and to a negative connection of a DC intermediate circuit, the common, central connection of the branch modules forming a load connection and the branch modules comprising at least one switch module, which switch modules comprise at least one power semiconductor switch with an associated circuitry network, a freewheel circuit and a current limiter; wherein b) the branch modules are arranged within said at least one phase module such that a commutation circuit, which is formed by the DC intermediate circuit, the positive connection, the negative connection and the branch modules, comprises a circuit area which is so small that each switch contributes at most 500 nH to a total stray inductance of said at least one phase module.

2. The converter arrangement as claimed in claim 1, wherein the branch modules are arranged parallel to a main direction running between the positive and negative connections and the load connection.

3. The converter arrangement as claimed in claim 1, wherein the branch modules are arranged at right angles to a main direction running between the positive and negative connections and the load connection.

4. The converter arrangement as claimed in claim 2, wherein the branch modules form the limbs of a "U".

5. The converter arrangement as claimed in claim 2, wherein the switch modules of the branch modules are arranged in a meandering shape.

6. The converter arrangement as claimed in claim 1, wherein
   a) an even number of phase modules are provided,
   b) the branch modules of two phase modules in each case are arranged in mirror-image symmetry with respect to a separating plane which is formed by a busbar of either the positive connection or the negative connection, and
   c) the positive and negative connections are arranged on the same side of the converter arrangement.

7. The converter arrangement as claimed in claim 2, wherein
   a) the freewheel circuit is connected in series with the power semiconductor switch and comprises essentially one freewheeling diode;
   b) one reverse-connected parallel diode is reverse-connected in parallel with each power semiconductor switch;
   c) the circuitry network is connected in parallel with the power semiconductor switch;
   d) the power semiconductor switches of switch modules of at least some of the branch modules are arranged along a stack direction in a common switch stack, while the freewheeling diodes and reverse-connected parallel diodes of the power semiconductor switches of switch modules of said at least some of the branch modules are arranged in a dedicated diode stack which runs in the stack direction; and
   e) the power semiconductor switches of switch modules of said at least some of the branch modules are electrically connected to the reverse-connected parallel diodes in a connection direction which runs essentially at right angles to the stack direction.

8. The converter arrangement as claimed in claim 7, wherein
   a) cooling boxes are arranged between the diodes and the switches of the diode stack and switch stack, and
   b) the switch stack and the diode stack are held together by means of a clamping-in device.

9. The converter arrangement as claimed in claim 8, wherein a common freewheeling resistor is provided for, in each case, two switch modules, which freewheeling resistor is connected between the freewheeling diodes of the corresponding switch modules as a planar resistor which is integrated in the diode stack and is located between the freewheeling diodes.

10. The converter arrangement as claimed in claim 9, wherein turn-off thyristors are provided as power semiconductor switches, which thyristors are driven by drive units which are arranged above the switch stacks in the connection direction.

11. The converter arrangement as claimed in claim 4, wherein
   a) at least two planes of switch modules, which are arranged in a U-shape or a meandering shape, are arranged one above the other or side-by-side in said branch modules, and
   b) the switch modules are connected such that a magnetic field which can form in conductor loops of the at least two planes of switch modules runs in an opposite direction in corresponding conductor loops of opposite planes.

12. The converter arrangement as claimed in claim 1, wherein the positive connection and the negative connection each form a hollow cylinder, which cylinders coaxially surround the branch modules and switch modules.

* * * * *